United States Patent [19]

Vo et al.

[11] Patent Number: 5,329,147
[45] Date of Patent: Jul. 12, 1994

[54] HIGH VOLTAGE INTEGRATED FLYBACK CIRCUIT IN 2 μM CMOS

[75] Inventors: Tuan A. Vo, Hawthorne; Mohamad M. Mojaradi; Aram Nahidipour, both of Los Angeles, all of Calif.

[73] Assignee: Xerox Corporation, Stamford, Conn.

[21] Appl. No.: 359

[22] Filed: Jan. 4, 1993

[51] Int. Cl.[5] .................. H01L 27/02; H01L 29/72
[52] U.S. Cl. ............................... 257/378; 257/577; 257/557; 257/566; 257/362
[58] Field of Search ............ 257/378, 577, 557, 566, 257/362

[56] References Cited

U.S. PATENT DOCUMENTS 5,118,635  6/1992  Frisina et al. ................ 257/378
5,146,298  9/1992  Eklund ......................... 257/378

Primary Examiner—Mark V. Prenty
Attorney, Agent, or Firm—Robert Cunha

[57] ABSTRACT

When a field effect transistor is used to control the current through an inductive load, the flyback voltage is felt through the vertical pnp transistor at the drain, which onducts to the substrate. This current represents a power loss and a source of heat. This invention supplies a second lateral transistor which conducts this current back to the power supply.

2 Claims, 7 Drawing Sheets

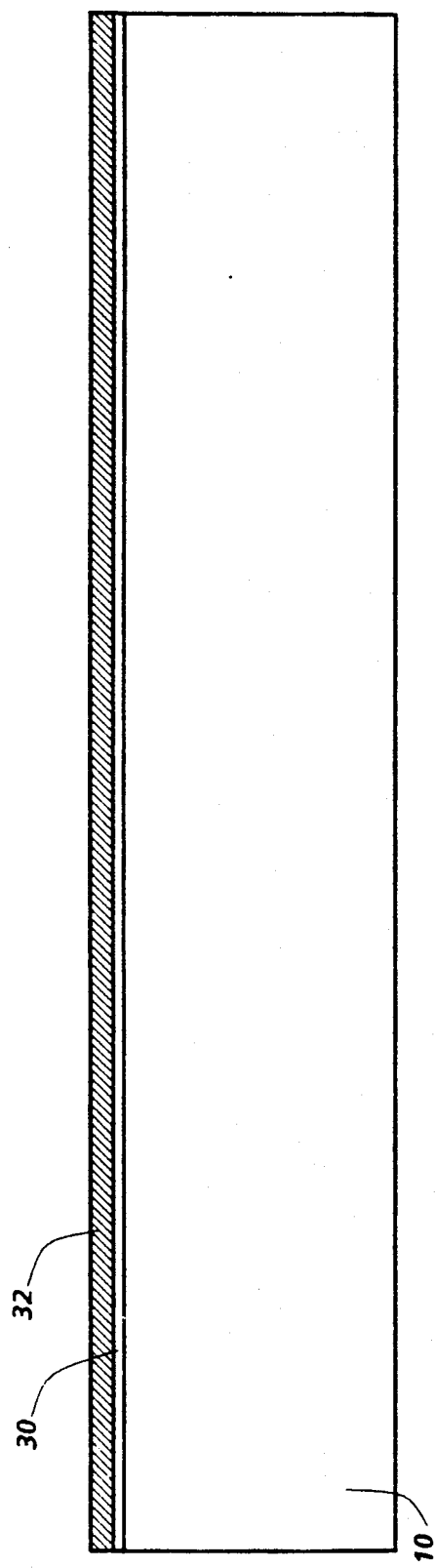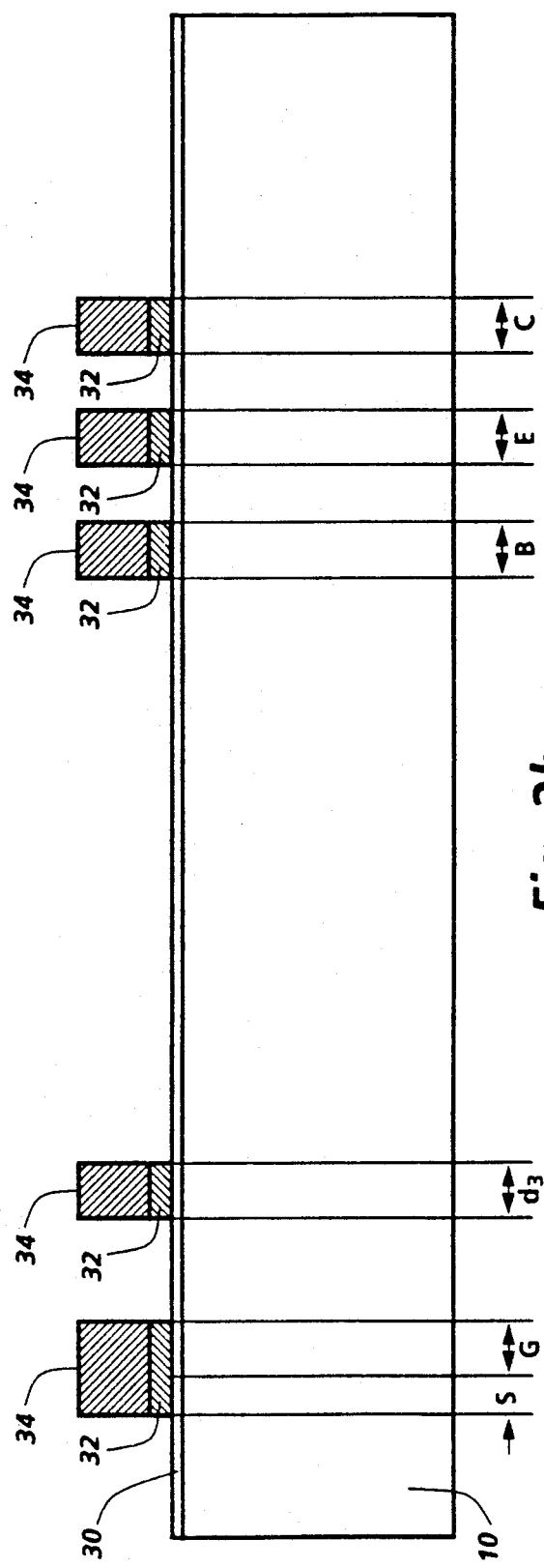
Fig. 2a
Fig. 2b

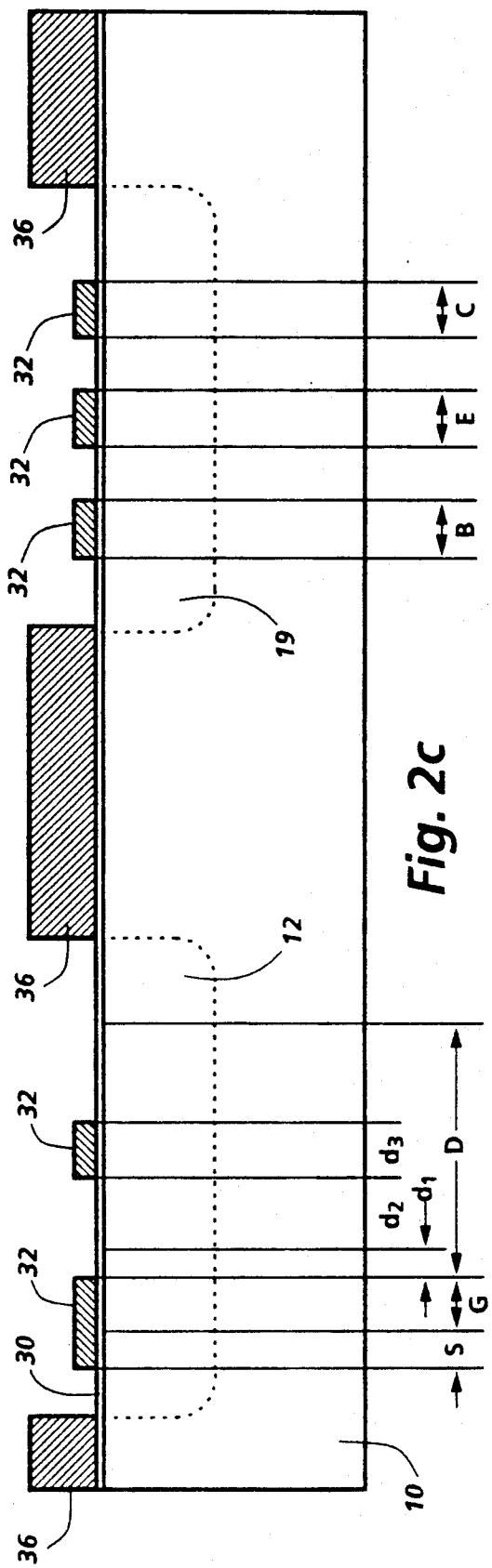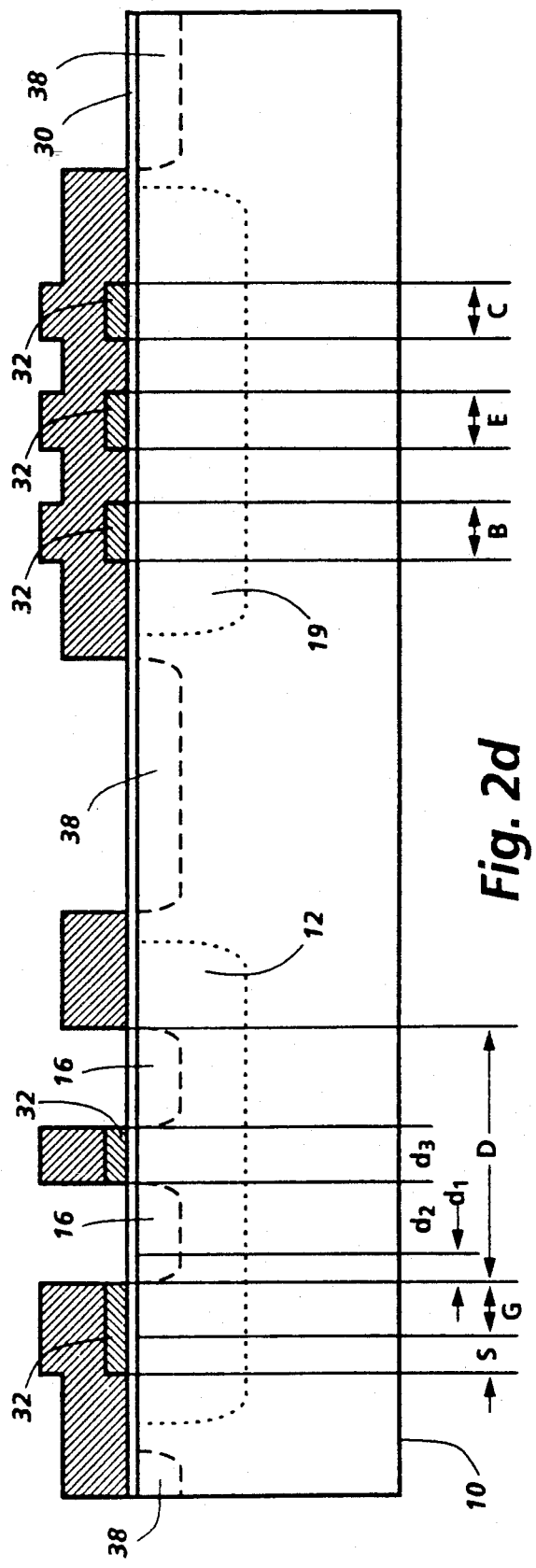

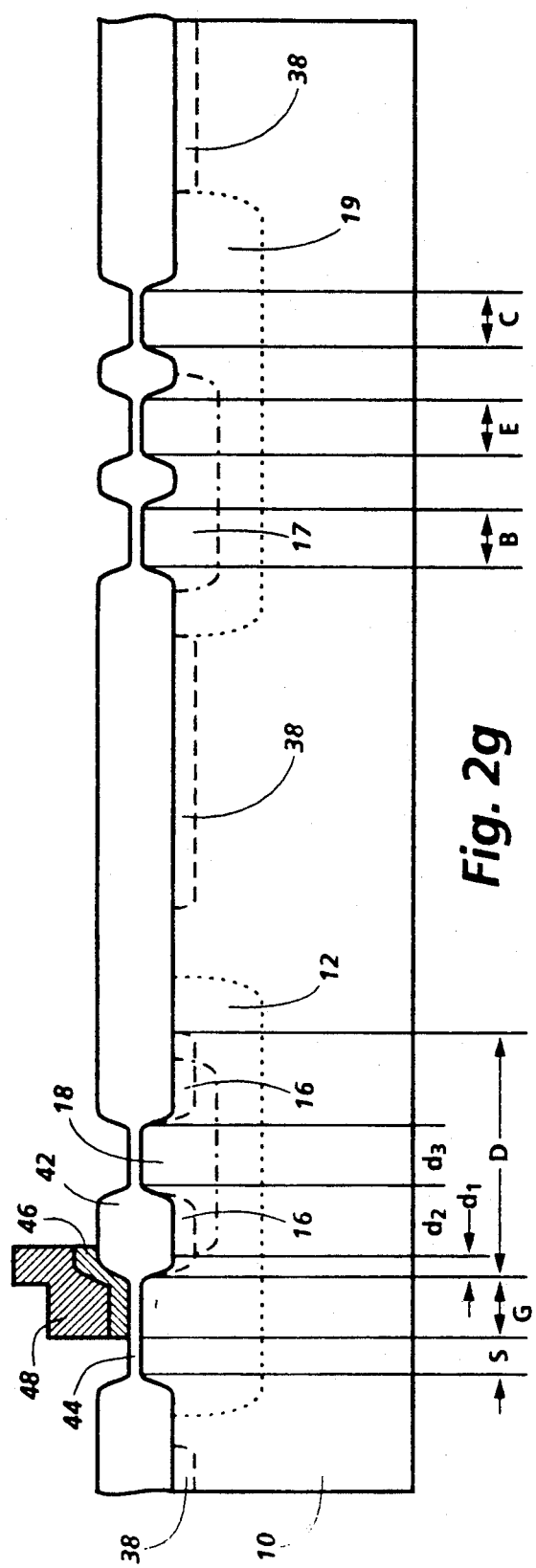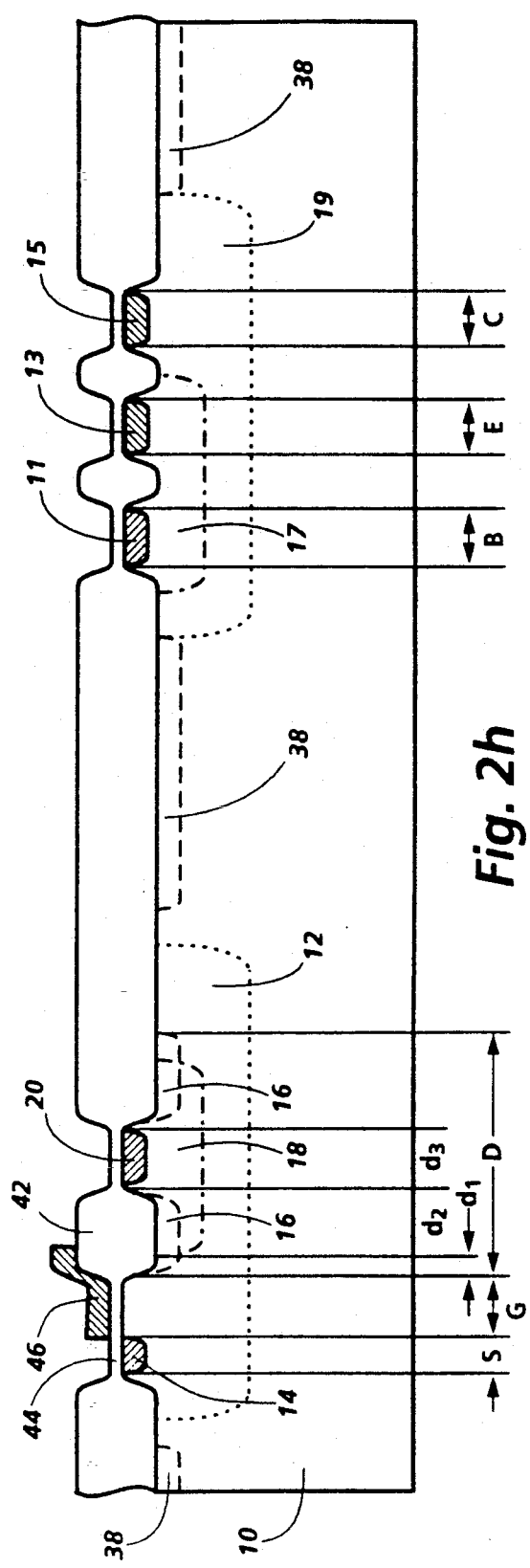

HIGH VOLTAGE INTEGRATED FLYBACK CIRCUIT IN 2 μM CMOS

BACKGROUND OF THE INVENTION

A circuit in an integrated CMOS device for more efficiently handling the flyback voltage of an inductive load by providing an additional bipolar transistor for shunting flyback current to the positive voltage source rather than to ground, the entire circuit being fabricated using a CMOS or a BiMOS process.

It is typical in a CMOS device with an inductive load to connect the inductance between the positive dc voltage source and the drain of an NMOS field effect transistor, FET, and to use the FET to alternately supply or cut off current to the inductance. Further, because the p+ source and drain junction of a PMOS are within an n-well on a p-substrate, there automatically exists a vertical bipolar pnp transistor to the substrate. It is also typical to use this pnp transistor to clamp the inductive flyback voltage. When the FET cuts off, the large flyback voltage generated by the inductance is felt at the emitter of this vertical transistor, and there will be a heavy flow of current from the positive voltage supply through the inductance and through this vertical transistor to the substrate. While this limits the flyback voltage, and thereby serves to prevent damage to the circuit, this process is inefficient since this current represents a loss of power in the device, which leads to higher power consumption and a higher device temperature. A circuit which can be fabricated within the basic CMOS process without any added steps or masks, and which would improve the efficiency of the circuit, is needed.

SUMMARY OF THE INVENTION

This circuit improves the performance of the circuit by providing a second lateral bipolar transistor which discharges the flyback voltage back to the positive dc voltage source, thus reducing the amount of d.c. power consumed and minimizing power and heat dissipation requirements. The performance of the lateral transistor is enhanced, and the performance of the vertical transistor is degraded, to maximize the performance of the entire circuit.

BRIEF DESCRIPTION OF THE DRAWINGS

FIGS. 2a through 2j are a detailed description of the BiMOS process steps.

DETAILED DESCRIPTION OF THE INVENTION

Figure 1A:
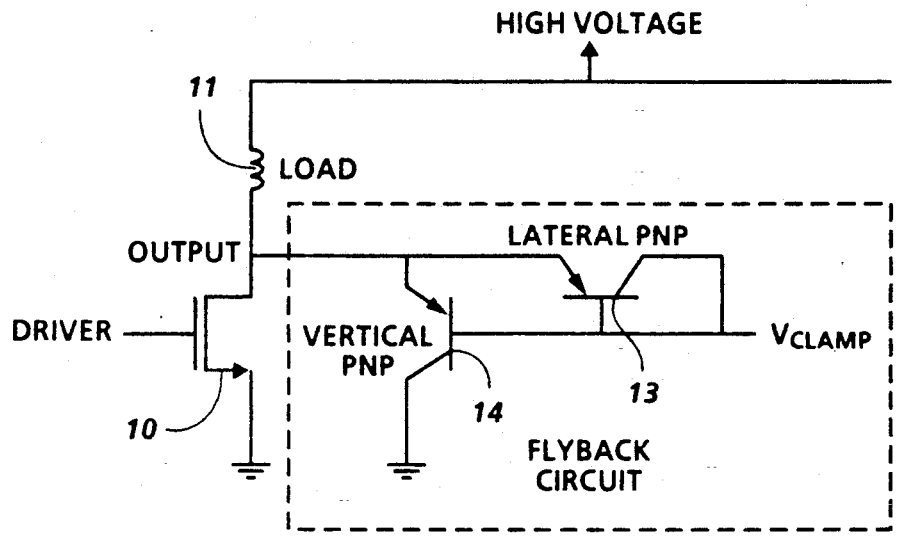
FIG. 1a is a schematic diagram of the circuit.

FIG. 1a shows the circuit in schematic form. A switching FET 10 supplies current to an inductive load 11. When the transistor 10 cuts off, the vertical transistor 14, which is automatically formed on the substrate in the process of fabricating the FET, will conduct. This current limits the high positive flyback voltage which would otherwise be generated at the inductance, and prevents damage to the circuit, but this additional current between the dc voltage source and ground represents a dissipation of power and an increase in heat generated by the device. It would be an improvement if this power could be returned to the dc voltage source.

This can be accomplished by fabricating on the substrate a second lateral bipolar transistor 13. If the collector of this lateral transistor 13 is connected to the base of the vertical transistor 14 and is also clamped to the high voltage source, a fraction of the flyback current will be returned to the voltage source, which will improve the efficiency of the circuit. An added improvement would be to provide the lateral transistor with the best possible gain, and to provide the vertical transistor with the worst possible gain, to maximize circuit performance.

Figure 1B:
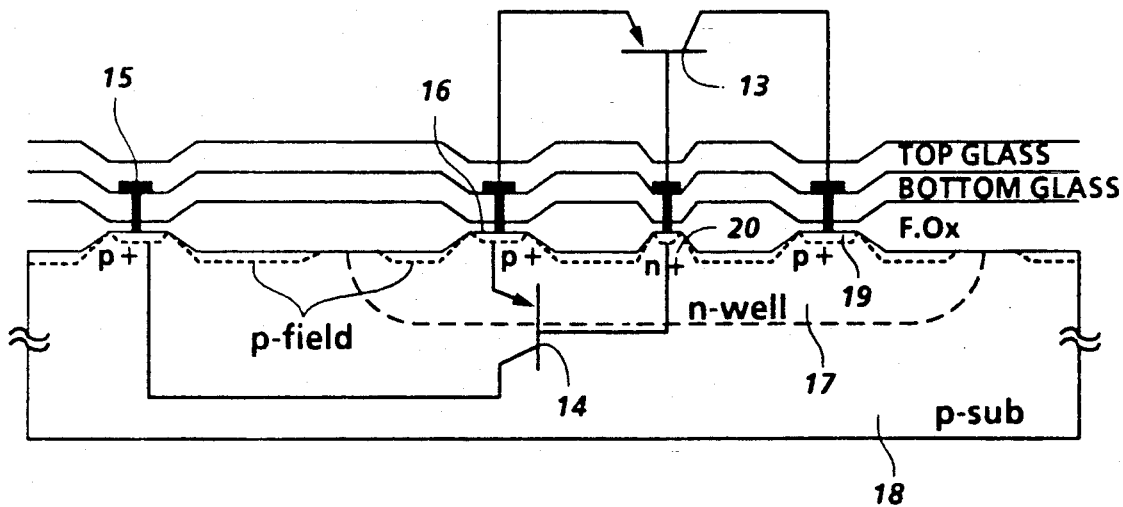
FIG. 1b shows the structure of the device.

FIG. 1b shows the structure of the two transistors 13, 14. The lateral transistor 13 is shown having a p+ area which is the emitter 16, an n+ area which is the base, 20 and a p+ area which is the collector 19. The vertical transistor 14 comprises the same p+ area as its emitter 16, the n-well 17 as the base and the p-substrate 18 as the collector. The equivalent schematic diagram of this circuit is shown in bold lines.

To allow as large a percentage of the current as possible to flow through the lateral transistor, the minimum design rule is used for the base width of the lateral pnp transistor 13 so that it is only half that of the vertical transistor 14, which is the depth of the n-well. To reduce the current gain of the vertical transistor 14 even further, contact for the vertical transistor's collector is intentionally located away from its base so that its collector resistance is substantially higher. Therefore, during the on-state, the lateral device will carry most of the current, leaving very little current flowing to ground through the vertical device.

A subset of a BiMOS process for fabricating CMOS and bipolar transistors is used as an example of a process for fabricating this circuit. The following description of the normal complete BiMOS process is included to teach the simultaneous fabrication of both FET and bipolar devices on a single substrate. This description is taken from "Bipolar Transistors with High Voltage MOS Transistors in a Single Substrate", U.S. Pat. No. 5,229,308, and is incorporated by reference herein. This described process is an example of a BiMOS process further modified to produce a high voltage npn transistor and also a high voltage PMOS device with a triple diffused conductive drift region. Referring now to FIGS. 2a through 2j, a sequence of process steps used to manufacture a MOS transistor 6 and a bipolar transistor 8 according to the present invention is shown. Thicknesses of the layers shown are not necessarily proportional.

In FIG. 2a there is shown the p-type silicon substrate 10 with an initial oxide layer 30 grown on substrate 10 and an initial nitride layer 32 deposited on the silicon oxide layer 30. The oxide layer is grown using conventional methods and may be from 200 Å to 500 Å thick. The nitride layer is deposited using conventional methods and may be from 800 Å to 1200 Å thick.

In FIG. 2b, using conventional patterning techniques, a photoresist layer 34 with a thickness of from 1.0 μm to 2.0 μm is formed. The nitride layer 32 shown in FIG. 2a is then etched to provide the nitride structure 32 shown in FIG. 2b. This remaining nitride layer 32 defines the regions that will eventually become the diffusion areas of the MOS transistor 6 and the bipolar transistor 8. The source contact region 14, drain contact region 20, base contact region 11, emitter region 13, and the collector region 15 have all been designated and will be formed underneath the remaining nitride layer 32 in subsequent steps.

Subsequently, as shown in FIG. 2c, n-wells 12, 19 are formed by use of the n-well mask forming a new photoresist pattern 36 and a subsequent n-well implant, these steps being performed in the conventional manner. A conventional high energy implant process utilizing a dosage from $1 \times 10^{12}$ atoms per square centimeter to $5 \times 10^{12}$ atoms per square centimeter with an energy level from 200 Kev to 300 Kev is used to penetrate the nitride/oxide pattern. Since the photoresist 36 is approximately ten times thicker than either nitride or oxide, the implant will not penetrate through the photoresist pattern but will penetrate the oxide 30 and nitride 32 not covered by the photoresist 36. The photoresist layer 36 is deposited according to conventional techniques.

In the next process step shown in FIG. 2d, boron field implant regions are made using the same conventional masking process steps and implantation process steps used in forming the n-well region 12. The boron field implants are implanted at a concentration of $5 \times 10^{12}$ atoms per square centimeter to $9 \times 10^{12}$ atoms per square centimeter and an energy of 20 Kev to 30 Kev. After drive-in, the concentration of boron will be between approximately $1 \times 10^{17}$ atoms per cubic centimeter to $5 \times 10^{17}$ atoms per cubic centimeter. The field implants will provide both the channel stop regions 38 and the first drift region contact 16 within the drain region "D" of the transistor. Since the implant is performed with a low energy, the nitride layer will block the field implant.

Figure 2E:
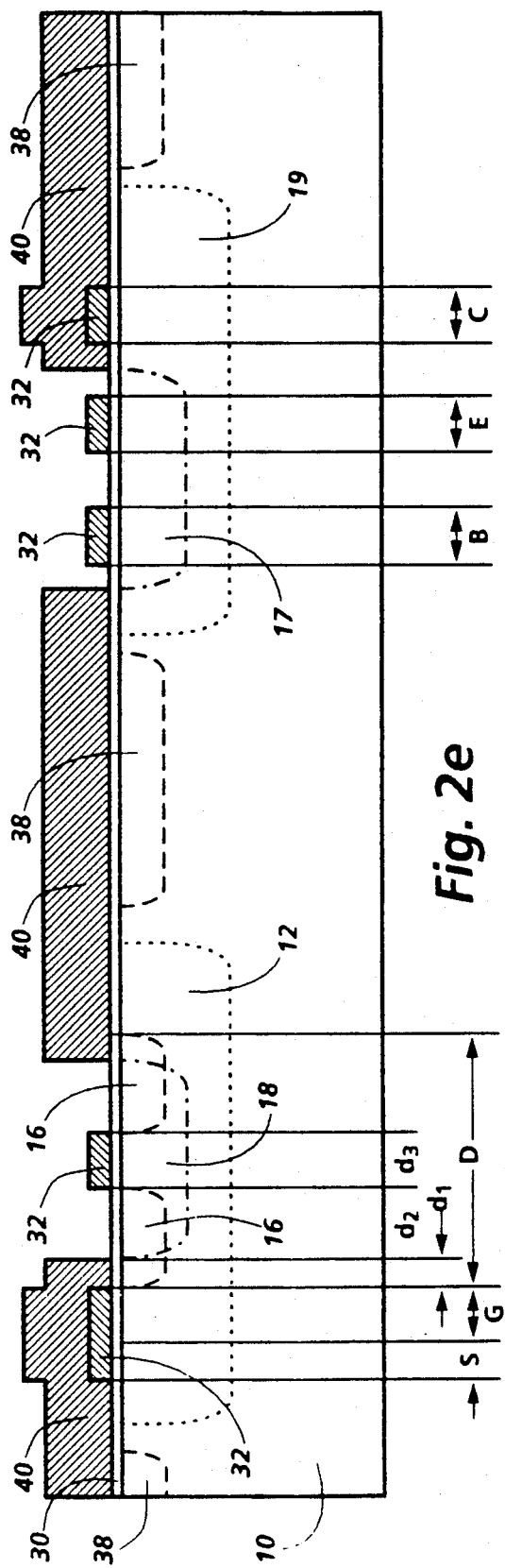

Using a photo resist pattern 40 and the conventional implanting techniques of the previous steps, a p-well implant region is made as is shown in FIG. 2e. The implant dosage is in the range of $5 \times 10^{12}$ atoms per square centimeter to $9 \times 10^{12}$ atoms per square centimeter and the implant energy is from 85 Kev to 110 Kev. After drive-in, the concentration of boron will be between approximately $3.5 \times 10^{17}$ atoms per cubic centimeter to $6.5 \times 10^{17}$ atoms per cubic centimeter. This process step will simultaneously make both the second drift region implant 18 of the high voltage MOS transistor and the base region 17 of the bipolar transistor 8. This enables the production of the MOS transistor 6 with bipolar transistors 8 without using the extra masks and implant steps that would be needed in a traditional process. These steps can be combined for any processes that seek to make both bipolar and MOS transistors on a single substrate. Since the implant is performed with a high energy, the nitride layer will not block the implant.

The completion of the transistor is shown in FIGS. 2f through 2j and follows well known and conventional process techniques.

Figure 2F:
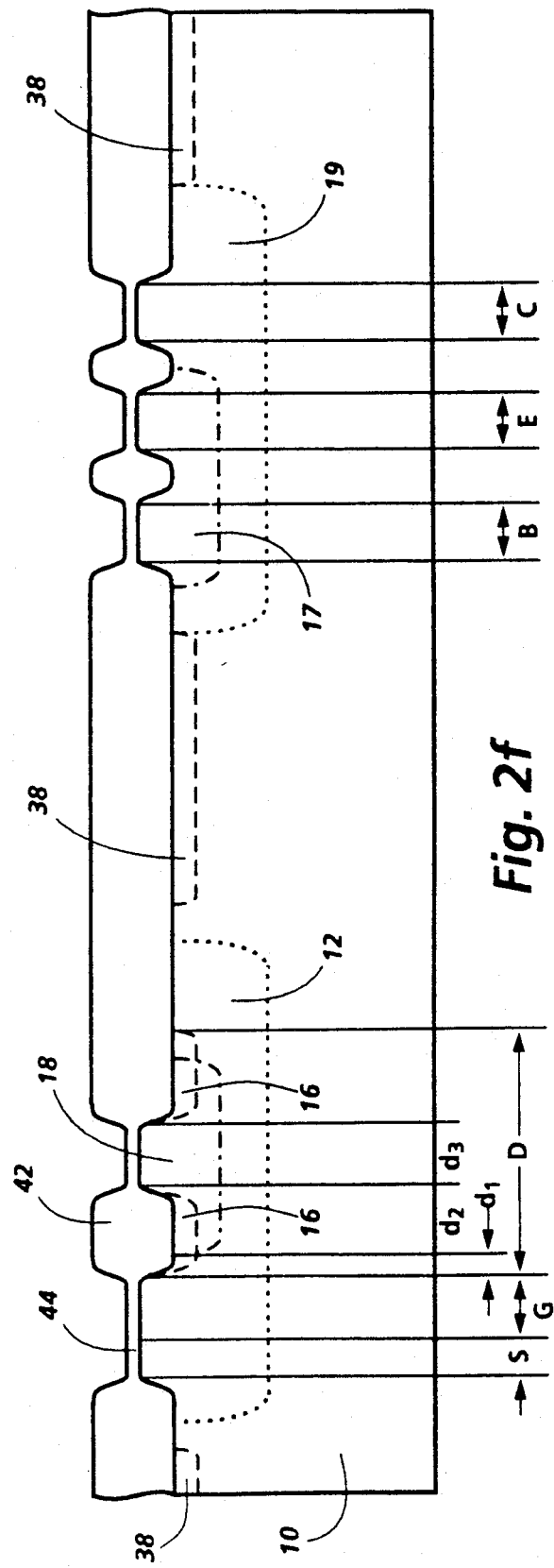

In FIG. 2f, the remaining nitride layer 32 is etched away, and field oxides 42 and gate oxides 44 are grown. The field oxides are from 1000 Å to 9000 Å thick and the gates oxides are from 200 Å to 400 Å thick. Notice also, that some lateral diffusion of the channel stop region 38 occurs resulting in contact between the channel stop region 38 and n-well region 19.

Subsequently, the polysilicon gate 46 of the transistor is shown after formation in FIG. 2g. The steps of polysilicon deposition, definition of polysilicon areas with a new mask and photoresist pattern 48, and then poly etch of all areas not protected by photoresist 48 are performed. The polysilicon gate 46 has a thickness of from 3000 Å to 5000 Å.

Once again, the mask and photoresist pattern is changed to define the N+ implant areas that will become the emitter area 13 and the collector area 15 (see FIG. 2h) for the bipolar transistor and those areas are implanted with phosphorus at an implant level of $5 \times 10^{15}$ atoms per square centimeter to $5 \times 10^{16}$ atoms per square centimeter at an energy level of from 70 Kev to 80 Kev. Then the mask and photoresist pattern is changed to define the source contact 14 and drain contact 20 areas of high voltage transistor and the base area 11 of the npn bipolar transistor, and these areas are implanted with boron. The boron implantation is at a dosage of $1 \times 10^{15}$ atoms per square centimeter to $5 \times 10^{15}$ atoms per square centimeter and energy level of from 55 Kev to 75 Kev. This implant step will create the p+ -type source implant region 14 as well as the final p+ area in the drain contact region 20 and the base region 11 of the npn bipolar transistor as is shown in FIG. 2h.

The transistor has three concentration regions, "d1", "d2", "d3" within the drain region "D". Region "d1" is the first drift region and is the area where only the first drift region implant 16 has been implanted. The concentration of this region "d2" is between approximately $1 \times 10^{17}$ atoms per cubic centimeter to $5 \times 10^{17}$ atoms per cubic centimeter. Region "d2" is the second drift region and is located where the first drift region implant 16 and the second drift region implant 18 overlap. Because the concentrations are additive the resultant concentration is between approximately $4.5 \times 10^{17}$ atoms per cubic centimeter to $11.5 \times 10^{17}$ atoms per cubic centimeter. Region "d3" is the just finished drain contact region 20.

It is the now finished triple diffused "d1", "d2", "d3" drain region "D" that gives the transistor its special high voltage characteristics. Depending upon scalable device dimensions, this transistor operates within a voltage range of 50 volts to 200 volts, well above the normal operating range of conventional transistors of 5 volts. This drain region "D" is composed of three separate increasing implant concentration regions, first and second drift regions "d1", "d2", and the drain contact region "d3" that were made in the steps shown in FIGS. 2d, 2e, and 2h. In contrast to the conventional processes for making a transistor, the processing of the triple diffused drain transistor of the above described invention is effected by combining step sequences with other structures to be present on the semiconductor device, so that a transistor of increased complexity can be built without increasing the complexity of the processing sequence.

Figure 2I:
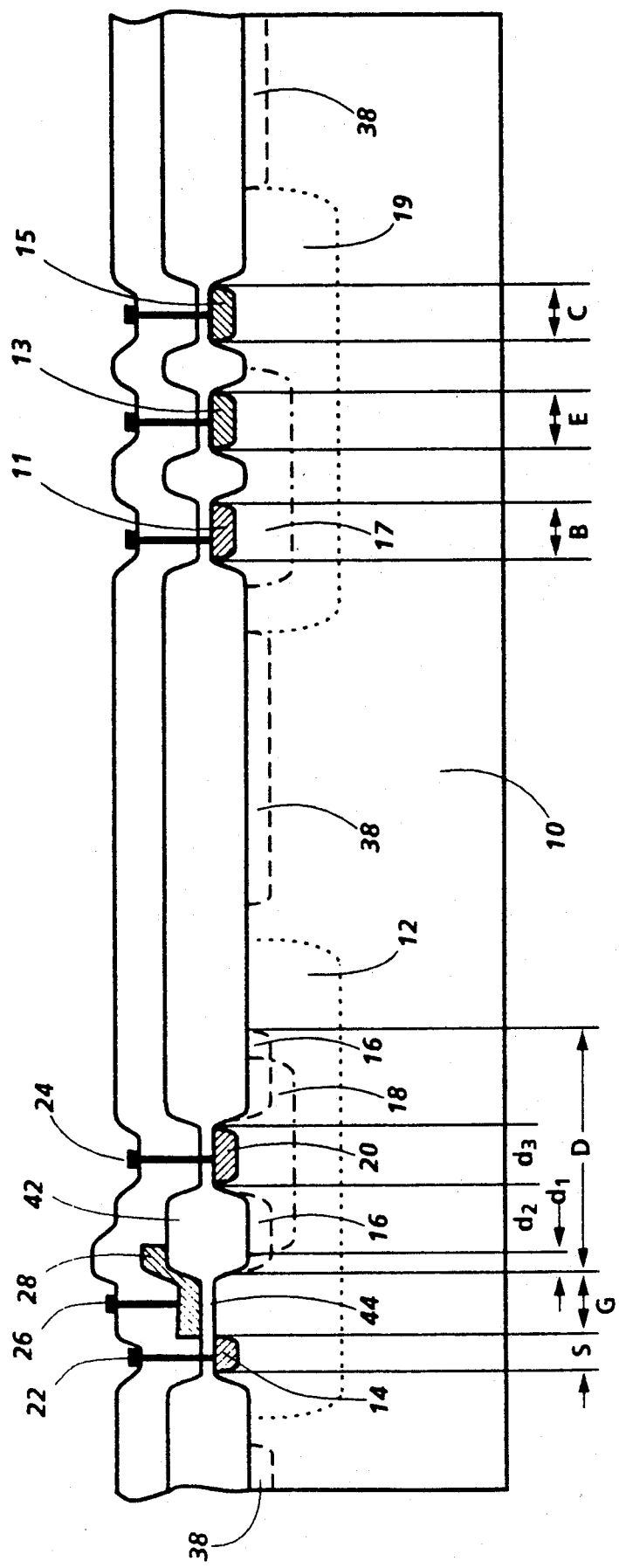
Figure 2J:
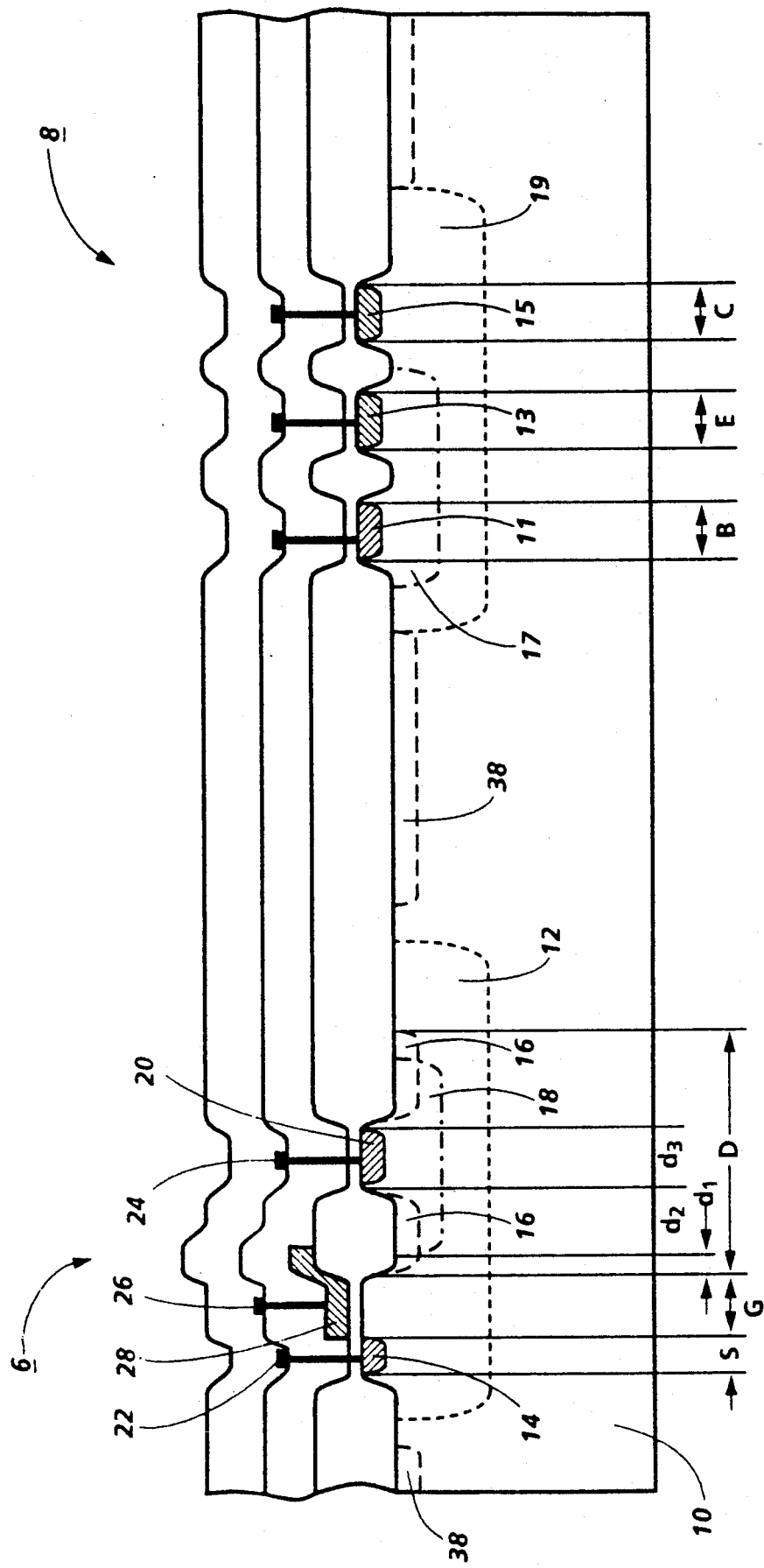

The remaining processes shown in FIGS. 2i through 2j for making contacts, metal lines, electrodes 22, 24, 26 passivation layers etc. are all done in a conventional manner to complete the integrated semiconductor device shown in FIG. 2j.

Although the invention has been described as being fabricated on a p-type substrate, it is understood that there is an equivalent process where the transistors could be fabricated on a n-type substrate. In this equivalent process, boron would be implanted wherever phosphorus had been implanted and phosphorus would be implanted wherever boron had been implanted. This would result in an equivalent transistor where all n-type structures would now be p-type structures and all p-type structures would now be n-type structures.

Although the invention has been described with reference to particular means, methods, and embodiments, it is to be understood that the invention is not confined to the embodiment described in the foregoing and illustrated herein, but extends to all equivalents within the spirit and the scope of the claims.

We claim:

1. A circuit comprising a bipolar transistor having an emitter, base and collector, for clamping the drain of a field effect transistor having a drain, to a positive voltage comprising:
 an n-well in a p-substrate,
 a p+ area in said n-well which forms the field effect transistor drain and the bipolar transistor emitter,
 a first n+ area in said n-well which forms the bipolar transistor base,
 a second p+ area in said n-well which forms the bipolar transistor collector, and
 said collector coupled to said positive voltage.

2. A circuit comprising a lateral bipolar transistor having an emitter, base and collector, for clamping the drain of a field effect transistor having a drain, to a positive voltage comprising:
 a p-well in an n-substrate,
 an n+ area in said p-well which forms the field effect transistor drain and the bipolar transistor emitter,
 a first p+ area in said p-well which forms the bipolar transistor base,
 a second n+ area in said p-well which forms the bipolar transistor collector, and
 said collector coupled to said positive voltage.

* * * * *